United States Patent
Chen et al.

(10) Patent No.: US 8,552,376 B2
(45) Date of Patent: Oct. 8, 2013

(54) PYROELECTRIC MOTION DETECTION CIRCUIT

(75) Inventors: Gui Chen, Yueqing (CN); Dafang Huang, Yueqing (CN)

(73) Assignee: Gui Chen, Yueqing (CN)

( * ) Notice: Subject to any disclaimer, the term of this patent is extended or adjusted under 35 U.S.C. 154(b) by 485 days.

(21) Appl. No.: 12/821,293

(22) Filed: Jun. 23, 2010

(65) Prior Publication Data

US 2011/0260061 A1    Oct. 27, 2011

(30) Foreign Application Priority Data

Apr. 22, 2010 (CN) .............................. 210 2 0170544

(51) Int. Cl.
*G01J 1/00* (2006.01)
(52) U.S. Cl.
USPC .................. 250/336.1; 250/338.1; 250/338.3
(58) Field of Classification Search
USPC ................................. 250/336.1, 338.1, 338.3
See application file for complete search history.

(56) References Cited

U.S. PATENT DOCUMENTS

| | | | | |
|---|---|---|---|---|
| 3,813,551 A | * | 5/1974 | Broadbent et al. | 250/338.1 |
| 4,121,098 A | * | 10/1978 | Jagoutz et al. | 378/49 |
| 4,415,806 A | * | 11/1983 | Tar | 250/339.15 |
| 2006/0081781 A1 | * | 4/2006 | Bluzer | 250/338.4 |

* cited by examiner

*Primary Examiner* — Michael G Lee
*Assistant Examiner* — Rafferty Kelly
(74) *Attorney, Agent, or Firm* — Mei & Mark LLP

(57) ABSTRACT

A pyroelectric infrared body sensing switch circuit comprises an amplification circuit, a delay unit, an execution unit, and an infrared detection circuit comprising one or more pyroelectric infrared detection elements. A power unit comprises first and second power circuits. Each of the first and second power circuits receives AC power and supplies DC power through RC voltage reduction, full-wave rectification, filtration, and voltage stabilization. The first power circuit supplies power to the execution unit and the second power circuit supplies power to the infrared detection circuit, the amplification circuit, and the delay unit. A signal outputted from the infrared detection circuit is inputted to the amplification circuit. A signal outputted from the amplification circuit controls the activation of the delay unit. A signal output from the delay unit controls the execution unit. The signal outputted from the infrared detection circuit comprises superposed output signals from the pyroelectric infrared detection elements.

14 Claims, 3 Drawing Sheets

PYROELECTRIC MOTION DETECTION CIRCUIT

This application claims the benefit of priority of Chinese patent application 201020170544.X, filed Apr. 22, 2010, the content of which is incorporated herein by reference in its entirety.

TECHNICAL FIELD

The present disclosure relates generally to motion detection circuits. More specifically, a pyroelectric motion detection circuit that detects human motion.

BACKGROUND

Being capable of receiving weak far-infrared rays emitted from bodies for the purpose of detecting the existence of bodies in a certain area, pyroelectric infrared body sensing switch circuits are widely used in body detection applications such as burglar alarms, equipment safeguard devices, lighting controls in public places of dwelling houses, etc. Pyroelectric infrared body sensing switches are especially useful for lighting in public places of dwelling houses, where the switch can turn on automatically when a person passes by and keep a light on for a certain delay time, and then turn the light out after the person leaves. In this way, the switch can save much energy. The switch conforms to the environmental protection concept and is convenient for use.

Therefore, pyroelectric infrared body sensing switches are used for lighting control in more and more public places of dwelling houses. The present pyroelectric infrared body sensing switch circuit normally consists of a power supply unit, infrared detection & signal amplification unit, delay unit and execution unit. After an infrared signal from a human body is detected by the infrared detection device and is amplified by the signal amplification unit, it triggers the delay unit to start the time delay. After the preset time lapses, it outputs a signal to the execution unit to turn off the light or to control other appliances to act accordingly. Normally the delay unit adopts the time constant of the RC charge circuit, which is composed of a charge capacitor and a charge resistor as the reference. As restricted by the capacitance and volume of the capacitor, this mode can not provide a long time delay. Meanwhile, when the capacitance of the capacitor is more than 200 µF, the timing accuracy deteriorates, causing certain restrictions to the application occasions of the present pyroelectric infrared body sensing switch.

In addition, the power supply unit of the present pyroelectric infrared body sensing switch normally adopts a single power supply to provide the whole switch with power. There are two commonly used circuit forms. One is an RC voltage reduction mode, which has the advantages of low cost and small volume but also has the disadvantage of a relatively low power of the power supply. The other mode is a transformer voltage reduction mode. Although this mode can work more reliably and can provide a higher power, the volume of the power supply is large and the cost is high.

SUMMARY

The present pyroelectric motion detection circuit overcomes the deficiency of the present technology and provides a circuit which has a wide voltage range, a low power consumption, an extensive detection angle, a high accuracy, a long time delay, and a low cost.

In one embodiment a pyroelectric infrared body sensing switch circuit, comprises an amplification circuit, a delay unit, an execution unit, a power unit, and an infrared detection circuit. The power unit comprises a first power circuit and a second power circuit, each power circuit comprising a voltage reducer, a rectifier, a filter, and a voltage stabilizer. The infrared detection circuit comprises one or more pyroelectric infrared detection elements.

Each of the first power circuit and the second power circuit receives AC power from an AC power supply and supplies DC power through RC voltage reduction by the voltage reducer, full-wave rectification by the rectifier, filtration by the filter, and voltage stabilization by the voltage stabilizer. The first power circuit supplies power to the execution unit and the second power circuit supplies power to the infrared detection circuit, the amplification circuit, and the delay unit.

A signal outputted from the infrared detection circuit is inputted to the amplification circuit. A signal outputted from the amplification circuit controls the activation of the delay unit. A signal output from the delay unit controls the execution unit. The signal outputted from the infrared detection circuit comprises superposed output signals from the one or more pyroelectric infrared detection elements.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DETAILED DESCRIPTION

Reference will now be made in detail to the present exemplary embodiments, examples of which are illustrated in the accompanying drawings. Wherever possible, the same reference numbers will be used throughout the drawings to refer to the same or like parts.

Figure 1:
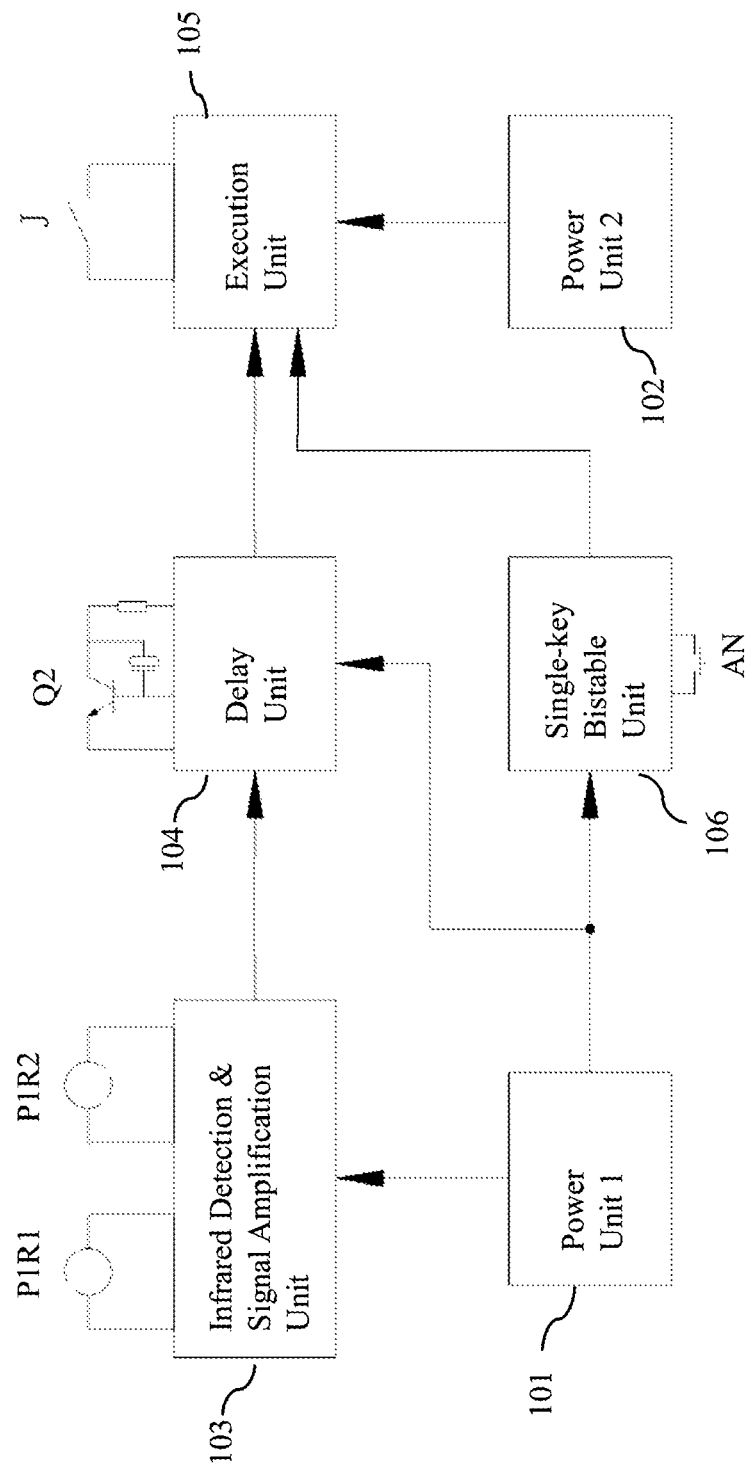
FIG. 1 is an example of an electrical block diagram.

As shown in FIG. 1, the pyroelectric infrared body sensing switch circuit comprises a first power unit 101, a second power unit 102, infrared detection & signal amplification unit 103, delay unit 104, and execution unit 105. A single-key bistable unit 106 is also present. Pyroelectric infrared detection elements P1R1 and P1R2 are associated with infrared detection & signal amplification unit 103. Amplification triode Q2 is associated with delay unit 104. Relay J is associated with execution unit 105. And, a button AN is associated with single-key bistable unit 106.

Figure 2A:
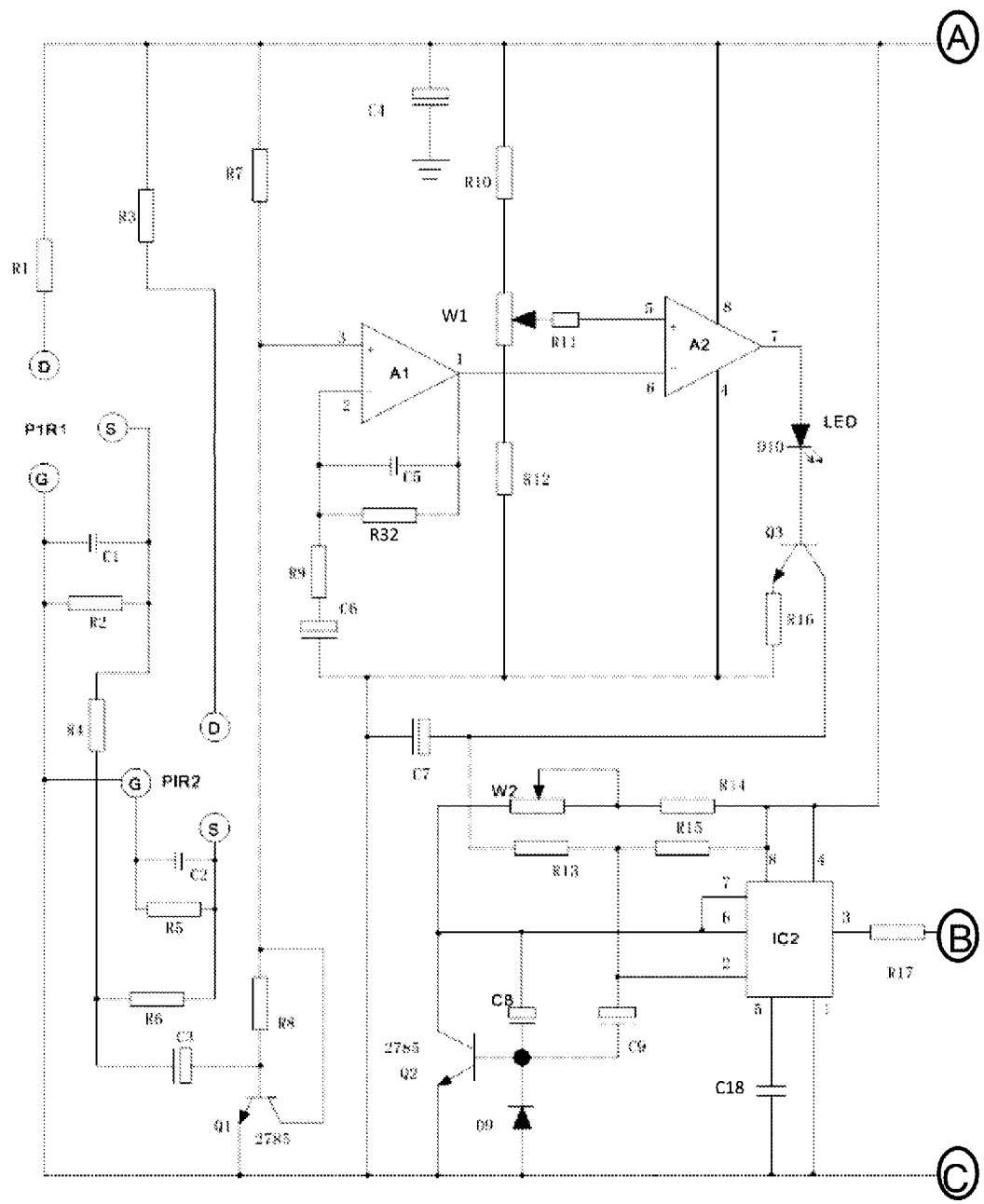
FIG. 2A is an example of an electrical schematic of a pyroelectric motion detection circuit.
Figure 2B:
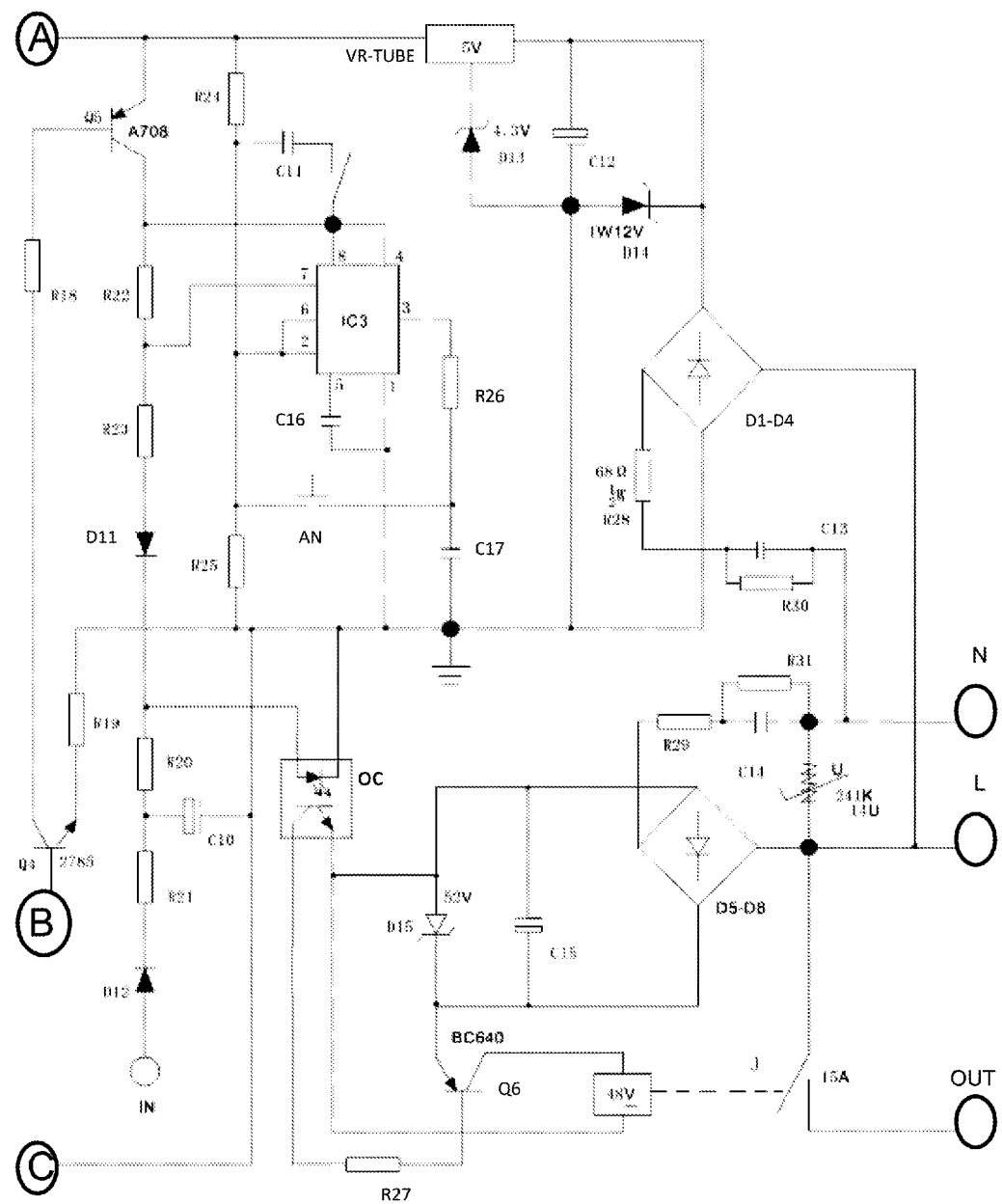
FIG. 2B is a continuation of the example of the electrical schematic of a pyroelectric motion detection circuit.

As shown in FIGS. 2A and 2B, which connect points A-A, B-B, and C-C, the power unit consists of two groups of power circuits. One group of DC power supply provides the execution unit with working power, in which the DC power supply is obtained from an AC power supply through RC voltage reduction of the resistor R29 and the capacitor C14, full-wave rectification of the diodes D5-D8, filtration of the capacitor C15 and voltage stabilization of the voltage stabilization diode D15. The other group provides the remaining part of the pyroelectric infrared body sensing switch circuit with working power, in which the DC power supply is obtained from AC power supply through RC voltage reduction of the resistor R28 and the capacitor C13, full-wave rectification of the diodes D1-D4, filtration of the capacitor C12 and voltage stabilization of the voltage stabilization diode D14 and 3-end voltage stabilizer.

To obtain a relatively large detection angle, the infrared detection & signal amplification unit can be provided with one or more groups of pyroelectric infrared detection elements. The output signals of all the pyroelectric infrared detection elements are superposed and then inputted to the amplification unit. Normally, depending on the actual conditions, 2-4 groups of pyroelectric infrared detection elements are sufficient. In this example, two groups of pyroelectric infrared detection elements are provided. The output ends (S ends) of the two groups of pyroelectric infrared detection elements are connected together through the resistor R4 and the resistor R5, allowing the output signals of the pyroelectric infrared detection elements to be superposed and then inputted into the amplification unit. The signal amplification unit shall be able to amplify the signals detected by the pyroelectric infrared detection elements. Moreover, it is preferable that the output should control the delayed startup of the delay unit after a certain signal intensity is obtained in order to improve the anti-interference ability.

In this example, two operational amplifiers A1 and A2 and their external elements are used to form the amplification circuit and comparator circuit respectively. The output end of the amplification circuit is connected to the reverse-phase input end of the comparator, and the normal-phase input end of the comparator is connected with a reference voltage. The reference voltage is obtained from the voltage shunting subcircuit composed of the resistor R10, the resistor R12, and the variable resistor W1.

In this pyroelectric infrared body sensing switch circuit, the delay unit can be composed of various monostable circuits equipped with a RC charge subcircuit to control the delay time. The charge capacitor of the said RC discharge subcircuit is connected in parallel across the collector and base of an amplification triode so that the amplification triode may form the charge bypass of the charge capacitor. The output signal of the said infrared detection & signal amplification unit controls the working of the delay unit.

In this embodiment, the delay unit is composed of a 555 time base circuit IC2 and its monostable circuit which consists of external components including amplification triode Q2. NPN type triode is selected for the amplification triode Q2. The collector and emitter of the amplification triode Q2 are connected across the discharge end and threshold end of the 555 time base circuit and the negative pole of the power supply respectively. The collector of the triode Q2 is connected to the positive pole of the power supply through the load resistor R14 and the resistor W2, which also act as a charge passage. The charge capacitor C8 is connected in parallel across the collector and base of the amplification triode Q2. Discharge diode D9 is connected in parallel across the base and emitter. The amplification triode Q2 forms the charge bypass of the charge capacitor C8.

The circuit is also provided with a trigger subcircuit that connects the amplification circuit and the delay unit. The trigger subcircuit includes the resistor R15, resistor R13, and capacitor C7 connected in series across the positive and negative poles of the power supply, the NPN switch triode Q3, and the current-limiting resistor R16. The emitter of the switch triode Q3 is connected with the negative pole of the power supply through the current-limiting resistor R16. The collector of the switch triode Q3 is connected with the positive pole of the capacitor C7. The output of the comparator circuit is connected with the base of the switch triode Q3.

The connection point of resistor R15 and resistor R13 is connected with the trigger end of the 555 time base circuit IC2. In this way, the output signal of the infrared detection & signal amplification unit can control the operation of the delay unit.

To avoid the occasion that the lighting goes out before a person leaves the detection scope of the pyroelectric infrared detection elements because the person stays in the scope for a period longer than the set delay time, in this circuit, a capacitor C9 is connected between the trigger end of the 555 time base circuit IC2 and the base of the switch triode Q3. The output end of the 555 time base circuit IC2 is connected with the composite amplification circuit composed of the amplification triode Q4 and amplification triode Q5 to control the photocoupler OC, and further to control the action of the working power of the relay J by controlling the on-off of the switch triode Q6. In this way, control to the lighting (or other electrical appliances) is realized.

The operational principle of this pyroelectric infrared body sensing switch circuit is as follows: When neither of the two groups of pyroelectric infrared detection elements detects any infrared signal from a human body, the normal-phase input end of the amplifier A1 is at a high level and the output is at a high level. This means that the reverse-phase input end of the amplifier A2 is at a low level and the output is at a low level. The switch triode Q3 is cut off. Therefore, the second pin, i.e. trigger end, of the 555 time base circuit IC2 is at a high level and the output is at a low level. The composite amplification circuit composed of the amplification triode Q4 and amplification triode Q5 is cut off. No current passes through the photocoupler. The switch triode Q6 is cut off. The relay J has no working power. The external lighting (or other electrical appliance) is off (or does not work). In the meantime, the charge capacitor C8 discharges through the seventh pin of the 555 time base circuit IC2, the internal triode, and the discharge diode D9.

When either of the two groups of pyroelectric infrared detection elements detects any infrared signal from a human body, the normal-phase input end of the amplifier A1 is at a low level and the output is at a low level. This means that the reverse-phase input end of the amplifier A2 is at a low level and the output is at a high level. The switch triode Q3 is broken over. Therefore, the second pin, i.e. trigger end, of the 555 time base circuit IC2 is at a low level and the output is at a high level. The composite amplification circuit composed of the amplification triode Q4 and amplification triode Q5 is broken over. Current passes through the photocoupler. The switch triode Q6 is broken over. The relay J actuates under the action of electricity. The external lighting (or other electrical appliance) turns on (or works).

In the meantime when the second pin, i.e. the trigger end, of the 555 time base circuit IC2 is at a low level and the output is at a high level, the internal triode of the 555 time base circuit IC2 is cut off. The current of the power supply flows through the resistor R14, the variable resistor W2, and the emitter of the amplification triode Q2 to charge the charge capacitor C8 until the voltage at the sixth pin, i.e. the threshold end, of the 555 time base circuit IC2 is higher than 2/3 VCC when the output end of the 555 time base circuit IC2 is converted to low level. The external lighting (or other electrical appliance) is off (or does not work), and the time is charge time.

Because the amplification triode Q2 forms the charge bypass of the charge capacitor C8, the charge current of the charge capacitor C8 is only one part in hFE (amplification factor of the triode Q2) of the collector current of the triode Q2. Therefore, for the same charge current, most of it is shunted by the collector of the triode Q2. So the voltage increasing rate of the delay capacitor C8 is only one part in hFE of the original amplification triode Q2, and the monostable delay time is hFE times the original 1.1 RC, i.e. 1.1hFE RC seconds. In this way, a long delay is obtained with a capacitor of small capacitance without sacrificing the delay precision.

In some occasions, the switch needs to be controlled manually. To realize this function concurrently, a single-key bistable unit is added to the above described scheme. The working power of the single-key bistable unit is controlled by the output of the delay unit. The output of the single-key bistable unit and the output of the delay unit control the execution unit jointly through the wire-and.

In this embodiment, the single-key bistable unit is composed of the 555 time base circuit IC3 and the external elements including resistor R24, resistor R25, resistor R26, capacitor C16 and capacitor C17. The resistor R24 and resistor R25, after being connected in series, are connected across the positive and negative poles of the power supply. The resistor R26 and capacitor C17 are connected between the output end of 555 time base circuit IC3 and the negative pole of the power supply. The second and fifth pins of 555 time base circuit IC3, i.e. the trigger end and the control end, are connected together and then connected to the connection point of the resistor R24 and resistor R25.

Between the connection point of the resistor R26 and capacitor C17 and the interconnection point of the second and fifth pins of the 555 time base circuit IC3, a button AN is provided, which forms the single-key bistable unit. Once the button AN is pressed, the level of the output end of the single-key bistable unit, i.e. the seventh pin of the 555 time base circuit IC3 changes. The seventh pin of the 555 time base circuit IC3, i.e. the discharge end, is connected with the output control circuit of the delay unit for the purpose of controlling the execution unit jointly. In this embodiment, it is connected to the connection point of the resistor R22 and the resistor R23 to form the "wire-and" relation. That is to say, when either the output of the delay unit or the seventh pin of the 555 time base circuit IC3 is at a low level, no current will flow through the photocoupler. The switch triode Q6 is cut off, the relay J has no working power, and the external lighting (or other electrical appliance) is off (or does not work).

However, the eighth pin, i.e. the power supply end, of the 555 time base circuit IC3 is connected to the collector end of the amplification triode Q5 in the output control circuit of the delay unit, making the working power of the single-key bistable unit be controlled by the output of the delay unit to ensure that the button AN functions only when any of the pyroelectric infrared detection elements detects an infrared signal from a human body.

Since the single-key button can be used as a normal switch in this setting, it can control the working of the execution unit at the same time when the infrared detection device detects the infrared signal from human body, improving the function of the switch circuit. It is preferable that the single-key bistable unit and the delay unit be composed of the 555 time base circuit and its external elements. In this case, the structure of the circuit can be simpler and the work can be stable.

As compared with the prior art, since multiple pyroelectric infrared detection elements are set in this pyroelectric motion detection circuit, the several pyroelectric infrared detection elements can face to different directions, increasing the detection angle. In addition, as a dedicated circuit for DC power supply is used to provide the execution unit with working power, the circuit structure can be simpler. This utility model also has a feature that the charge capacitor is connected in parallel across the collector and base of the amplification triode. The amplification triode forms the charge bypass of the charge capacitor. The charge current of the charge capacitor is only one part in hFE of the triode collector current. Therefore, for the same charge current, most of it is shunted by the collector of the triode. So the voltage increasing rate of the delay capacitor is only one part in hFE of the original device without the amplification triode and the monostable delay time is hFE times the original 1.1 RC, i.e. 1.1hFE RC seconds. In this way, a long delay is obtained with a capacitor of small capacitance without sacrificing the delay precision.

In the preceding specification, various preferred embodiments have been described with reference to the accompanying drawings. It will, however, be evident that various other modifications and changes may be made thereto, and additional embodiments may be implemented, without departing from the broader scope of the invention as set forth in the claims that follow. The specification and drawings are accordingly to be regarded in an illustrative rather than restrictive sense.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

We claim:

1. A pyroelectric infrared body sensing switch circuit, comprising:
   a power unit comprising a first power circuit and a second power circuit, each power circuit comprising a voltage reducer, a rectifier, a filter, and a voltage stabilizer, the second power circuit further compring a positive pole and a negative pole;
   an infrared detection circuit comprising one or more pyroelectric infrared detection elements;
   an amplification circuit;
   a delay unit comprising: a delay unit time base circuit comprising a trigger end, a discharge end, and a threshold end; a delay unit monostable circuit comprising external components and a delay unit amplification triode, the delay unit amplification triode comprising a base, a collector, and an emitter; and a monostable circuit equipped with an RC charge subcircuit to control delay time, the RC charge subcircuit comprising a charge capacitor and an amplification triode comprising a collector and a base;
   an execution unit;
   a plurality of amplification resistors;
   a discharge diode;
   a comparator circuit comprising an output; and
   a trigger subcircuit comprising:
      a trigger current limiting resistor;
      a trigger NPN switch triode comprising a base, an emitter, and a collector, the emitter of the trigger NPN switch triode connected to the negative pole of the power supply through the trigger current limiting resistor, the base of the trigger NPN switch triode connected to the output of the comparator circuit;
      a trigger capacitor comprising a positive pole connected to the collector of the trigger NPN switch triode; and
      first and second trigger resistors connected in series with the trigger capacitor and connected across the positive and negative poles of the power supply, the trigger NPN switch triode, and the trigger current limiting resistor, wherein:

each of the first power circuit and the second power circuit receives AC power from an AC power supply and supplies DC power through RC voltage reduction by the voltage reducer, full-wave rectification by the rectifier, filtration by the filter, and voltage stabilization by the voltage stabilizer, the first power circuit supplies power to the execution unit and the second power circuit supplies power to the infrared detection circuit, the amplification circuit, and the delay unit, a first signal outputted from the infrared detection circuit is inputted to the amplification circuit, a second signal outputted from the amplification circuit controls the activation of the delay unit, a third signal output from the delay unit controls the execution unit, the first signal outputted from the infrared detection circuit comprises superposed output signals from the one or more pyroelectric infrared detection elements, the charge capacitor of the RC charge subcircuit is connected in parallel across the collector and the base to form a charge bypass of the charge capacitor, the collector and emitter of the delay unit amplification triode are connected across the discharge end and threshold end of the delay unit time base circuit and the negative pole of the second power circuit, respectively, the collector of the delay unit amplification triode is connected to the positive pole of the second power circuit through the plurality amplification resistors, at least one of the plurality of amplification resistors also acts as a resistor in the RC charge subcircuit, the charge capacitor is connected in parallel across the collector and base of the delay unit amplification triode, the discharge diode is connected in parallel across the base and the emitter of the delay unit amplification triode, the trigger subcircuit connects the amplification circuit and the delay unit, and the first and second trigger resistors are connected at a connection point, and the connection point is connected with the trigger end of the delay unit time base circuit such that an output signal from the amplification unit controls the operation of the delay unit.

2. The circuit of claim 1, further comprising an infrared detection and signal amplification unit comprising the infrared detection circuit and the amplification circuit.

3. The circuit of claim 1, wherein the one or more pyroelectric infrared detection elements are grouped, and the infrared detection circuit comprises one or more groups of pyroelectric infrared detection elements.

4. The circuit of claim 1, wherein
the charge capacitor of the RC charge subcircuit forms a charge bypass of the charge capacitor.

5. The circuit of claim 1, further comprising:
a single-key bistable unit comprising a wire-and connection to the delay unit,
wherein the working power of the single-key bistable unit is controlled by the output of the delay unit, and
wherein the output of the single-key bistable unit and the output of the delay unit control the execution unit jointly through the wire-and.

6. The circuit of claim 1, further comprising a delay unit capacitor connected between the trigger end of the delay unit time base circuit and the base of the trigger NPN switch triode.

7. The circuit of claim 1, wherein:
the second power circuit further comprises a positive pole and a negative pole,
the single-key bistable unit further comprises:
a single-key time base circuit comprising an output end, a discharge end, a trigger end, and a control end;
first, second, and third single-key resistors;
first and second single-key capacitors; and
a button,
the first single-key resistor and the second single-key resistor are connected in series and are connected across the positive and negative poles of the second power circuit,
the third single-key resistor and second single-key capacitor are connected between the output end of the single-key time base circuit and the negative pole of the second power circuit,
the first and second single-key resistors are connected at a single-key connection point, and the trigger end and the control end of the single-key time base circuit are connected together and then connected to the single-key connection point,
the button is provided between the connection point between the third single-key resistor and the second single-key capacitor and the connection point of the trigger and control pins of the single-key time base circuit, and
the discharge end of the single-key time base circuit connects to the output of the delay unit, and the single-key time base circuit controls the delay unit and the execution unit.

8. The circuit of claim 1, further comprising a delay unit capacitor connected between the trigger end of the delay unit time base circuit and the base of the trigger NPN switch triode.

9. The circuit of claim 1, wherein the first power supply circuit does not supply power to infrared detection circuit, the amplification circuit or the delay unit, and wherein the second power supply circuit does not supply power to the execution unit.

10. A pyroelectric infrared body sensing switch circuit, comprising:
a power unit comprising a first power circuit and a second power circuit, each power circuit comprising a voltage reducer, a rectifier, a filter, and a voltage stabilizer, the second power circuit further comprising a positive pole and a negative pole;
an infrared detection circuit comprising one or more pyroelectric infrared detection elements;
an amplification circuit;
a delay unit;
an execution unit; and
a single-key bistable unit comprising a wire-and connection to the delay unit and the single-key bistable unit further comprises:
a single-key time base circuit comprising an output end, a discharge end, a trigger end, and a control end;
first, second, and third single-key resistors;
first and second single-key capacitors; and
a button,
wherein:
each of the first power circuit and the second power circuit receives AC power from an AC power supply and supplies DC power through RC voltage reduction by the voltage reducer, full-wave rectification by the rectifier, filtration by the filter, and voltage stabilization by the voltage stabilizer,
the first power circuit supplies power to the execution unit and the second power circuit supplies power to the infrared detection circuit, the amplification circuit, and the delay unit, a first signal outputted from the infrared detection circuit is inputted to the amplification circuit, a second signal outputted from the amplification circuit controls the activation of the delay unit, a third signal output from the delay unit controls the execution unit, the first signal outputted from the infrared detection circuit comprises superposed output signals from the one or more pyroelectric infrared detection elements, the working power of the single-key bistable unit is controlled by the output of the delay unit, the output of the single-key bistable unit and the output of the delay unit control the execution unit jointly through the wire-and, the first single-key resistor and the second single-key resistor are connected in series and are connected across the positive and negative poles of the second power circuit, the third single-key resistor and second single-key capacitor are connected between the output end of the single-key time base circuit and the negative pole of the second power circuit, the first and second single-key resistors are connected at a single-key connection point, and the trigger end and the control end of the single-key time base circuit are connected together and then connected to the single-key connection point, the button is provided between the connection point between the third single-key resistor and the second single-key capacitor and the connection point of the trigger and control pins of the single-key time base circuit, and the discharge end of the single-key time base circuit connects to the output of the delay unit, and the single-key time base circuit controls the delay unit and the execution unit.

11. The pyroelectric infrared body sensing switch circuit of claim 10, wherein the first power supply circuit does not supply power to infrared detection circuit, the amplification circuit or the delay unit, and wherein the second power supply circuit does not supply power to the execution unit.

12. The pyroelectric infrared body sensing switch circuit of claim 10, further comprising an infrared detection and signal amplification unit comprising the infrared detection circuit and the amplification circuit.

13. The pyroelectric infrared body sensing switch circuit of claim 10, wherein the one or more pyroelectric infrared detection elements are grouped, and the infrared detection circuit comprises one or more groups of pyroelectric infrared detection elements.

14. The pyroelectric infrared body sensing switch circuit of claim 10, wherein the delay unit comprises a monostable circuit equipped with an RC charge subcircuit to control the delay time, and the RC charge subcircuit comprises:

a charge capacitor; and an amplification triode comprising a collector and a base, wherein the charge capacitor of the RC charge subcircuit is connected in parallel across the collector and the base to form a charge bypass of the charge capacitor.

* * * * *